United States Patent
Hilliard et al.

(10) Patent No.: US 8,731,887 B2
(45) Date of Patent: May 20, 2014

(54) SYSTEM AND METHOD FOR OBTAINING A MODEL OF DATA DESCRIBING A PHYSICAL STRUCTURE

(75) Inventors: Lucas J. Hilliard, Oslo (NO); William P. Brown, Houston, TX (US); Indra N. Datta, Houston, TX (US)

(73) Assignee: ExxonMobile Upstream Research Company, Houston, TX (US)

(*) Notice: Subject to any disclaimer, the term of this patent is extended or adjusted under 35 U.S.C. 154(b) by 260 days.

(21) Appl. No.: 13/031,516

(22) Filed: Feb. 21, 2011

(65) Prior Publication Data

US 2011/0251830 A1 Oct. 13, 2011

Related U.S. Application Data

(60) Provisional application No. 61/323,144, filed on Apr. 12, 2010.

(51) Int. Cl.
*G06G 7/50* (2006.01)
*G01V 1/00* (2006.01)
*G06F 17/50* (2006.01)

(52) U.S. Cl.
CPC .. *G01V 1/00* (2013.01); *G06F 17/50* (2013.01)
USPC .................................................. 703/9; 703/2

(58) Field of Classification Search
USPC ......................................... 703/1–2; 364/512
See application file for complete search history.

(56) References Cited

U.S. PATENT DOCUMENTS

| | | | |
|---|---|---|---|
| 5,740,342 A | 4/1998 | Kocberber | |
| 5,905,657 A | 5/1999 | Celniker | |
| 6,035,255 A | 3/2000 | Murphy et al. | |
| 6,044,328 A | 3/2000 | Murphy et al. | |
| 6,070,125 A | 5/2000 | Murphy et al. | |
| 6,106,561 A * | 8/2000 | Farmer | 703/10 |
| 6,236,994 B1 | 5/2001 | Swartz et al. | |
| 6,278,949 B1 | 8/2001 | Alam | |

(Continued)

FOREIGN PATENT DOCUMENTS

| | | |
|---|---|---|
| CA | 2312341 | 6/1999 |
| EP | 1036341 | 2/2005 |

(Continued)

OTHER PUBLICATIONS

"Mixed Finite Element and RElated Control Volume Discretizations for Reservoir Simulation on Three-Dimensional Unstructured Grids," S.F. Matringe, R. Juanes, H.S. Tchelepi, SPE, Stanford University, (2007).*

(Continued)

*Primary Examiner* — Matt Kim
*Assistant Examiner* — Maryam Ipakchi
(74) *Attorney, Agent, or Firm* — ExxonMobil Upstream Research Company, Law Dept.

(57) ABSTRACT

There is provided a system and method for obtaining a model of data describing a physical structure. An exemplary method comprises defining a three-dimensional (3D) object that corresponds to a physical structure. The 3D object comprises a set of topological elements that each has an initial geometric definition. The exemplary method also comprises creating a subsequent model of the data by updating a subset of the topological elements in the 3D object. Each updated element in the subset has a geometric definition that has changed relative to its initial geometric definition.

25 Claims, 5 Drawing Sheets

(56) References Cited

U.S. PATENT DOCUMENTS

| | | |
|---|---|---|
| 6,373,489 B1 | 4/2002 | Lu et al. |
| 6,519,568 B1 | 2/2003 | Harvey et al. |
| 6,549,879 B1 | 4/2003 | Cullick et al. |
| 6,772,066 B2 | 8/2004 | Cook et al. |
| 6,826,483 B1 | 11/2004 | Anderson et al. |
| 6,829,570 B1 | 12/2004 | Thambynayagam et al. |
| 6,907,392 B2 | 6/2005 | Bennis et al. |
| 6,980,935 B2 | 12/2005 | Lu et al. |
| 7,003,439 B2 | 2/2006 | Aldred et al. |
| 7,027,925 B2 | 4/2006 | Terentyev et al. |
| 7,031,842 B1 | 4/2006 | Musat et al. |
| 7,047,165 B2 * | 5/2006 | Balaven et al. ............ 703/2 |
| 7,047,170 B2 | 5/2006 | Feldman et al. |
| 7,079,953 B2 | 7/2006 | Thorne et al. |
| 7,082,387 B1 * | 7/2006 | Wolfe, Jr. ............ 703/6 |
| 7,281,213 B2 | 10/2007 | Callegari |
| 7,337,067 B2 | 2/2008 | Sanstrom |
| 7,366,616 B2 | 4/2008 | Bennett et al. |
| 7,376,539 B2 * | 5/2008 | Lecomte ............ 703/1 |
| 7,379,386 B2 * | 5/2008 | Muyzert et al. ............ 367/63 |
| 7,437,358 B2 | 10/2008 | Arrouye et al. |
| 7,451,066 B2 * | 11/2008 | Edwards et al. ............ 703/2 |
| 7,460,957 B2 | 12/2008 | Prange et al. |
| 7,539,625 B2 | 5/2009 | Klumpen et al. |
| 7,548,873 B2 | 6/2009 | Veeningen et al. |
| 7,596,481 B2 | 9/2009 | Zamora et al. |
| 7,603,264 B2 | 10/2009 | Zamora et al. |
| 7,606,666 B2 | 10/2009 | Repin et al. |
| 7,616,213 B2 | 11/2009 | Chuter |
| 7,617,083 B2 * | 11/2009 | Bennis et al. ............ 703/10 |
| 7,627,430 B2 | 12/2009 | Hawtin |
| 7,634,395 B2 | 12/2009 | Flandrin et al. |
| 7,657,414 B2 | 2/2010 | Zamora et al. |
| 7,657,494 B2 | 2/2010 | Wilkinson et al. |
| 7,716,029 B2 | 5/2010 | Couet et al. |
| 7,725,302 B2 | 5/2010 | Ayan et al. |
| 7,796,468 B2 | 9/2010 | Kellogg |
| 7,881,911 B2 | 2/2011 | Kim et al. |
| 7,913,190 B2 | 3/2011 | Grimaud et al. |
| 7,925,483 B2 | 4/2011 | Xia et al. |
| 7,970,545 B2 | 6/2011 | Sanstrom |
| 8,094,515 B2 | 1/2012 | Miller et al. |
| 8,204,727 B2 | 6/2012 | Dean et al. |
| 8,325,179 B2 | 12/2012 | Murray et al. |
| 8,346,695 B2 | 1/2013 | Pepper et al. |
| 8,364,404 B2 | 1/2013 | Legendre et al. |
| 2001/0039487 A1 * | 11/2001 | Hammersley et al. ............ 703/2 |
| 2002/0038201 A1 * | 3/2002 | Balaven et al. ............ 703/2 |
| 2002/0120429 A1 * | 8/2002 | Ortoleva ............ 703/2 |
| 2004/0268338 A1 | 12/2004 | Gurpinar et al. |
| 2005/0015231 A1 * | 1/2005 | Edwards et al. ............ 703/10 |
| 2005/0125203 A1 * | 6/2005 | Hartman ............ 703/1 |
| 2005/0165555 A1 | 7/2005 | Jackson |
| 2005/0259101 A1 | 11/2005 | Westgaard et al. |
| 2006/0085174 A1 | 4/2006 | Hemanthkumar et al. |
| 2007/0156340 A1 | 7/2007 | Shray et al. |
| 2007/0199721 A1 | 8/2007 | Givens et al. |
| 2007/0213935 A1 | 9/2007 | Fagnou et al. |
| 2007/0266082 A1 | 11/2007 | McConnell et al. |
| 2007/0294034 A1 | 12/2007 | Bratton et al. |
| 2008/0088621 A1 | 4/2008 | Grimaud et al. |
| 2008/0162093 A1 * | 7/2008 | Nivlet et al. ............ 703/2 |
| 2008/0165185 A1 | 7/2008 | Smith et al. |
| 2008/0165186 A1 | 7/2008 | Lin |
| 2008/0255809 A1 | 10/2008 | Ran et al. |
| 2008/0262809 A1 | 10/2008 | Carruthers et al. |
| 2008/0289877 A1 | 11/2008 | Nikolakis-Mouchas et al. |
| 2008/0297510 A1 | 12/2008 | Callegari |
| 2008/0306803 A1 | 12/2008 | Vaal et al. |
| 2008/0312887 A1 | 12/2008 | Pao et al. |
| 2009/0027380 A1 | 1/2009 | Rajan et al. |
| 2009/0027385 A1 | 1/2009 | Smith |
| 2009/0037114 A1 | 2/2009 | Peng et al. |
| 2009/0043507 A1 | 2/2009 | Dommisse et al. |
| 2009/0089028 A1 | 4/2009 | Sagert et al. |
| 2009/0125362 A1 | 5/2009 | Reid et al. |
| 2009/0222742 A1 | 9/2009 | Pelton et al. |
| 2009/0229819 A1 | 9/2009 | Repin et al. |
| 2009/0259446 A1 * | 10/2009 | Zhang et al. ............ 703/2 |
| 2009/0295792 A1 | 12/2009 | Liu et al. |
| 2009/0299709 A1 | 12/2009 | Liu |
| 2009/0303233 A1 * | 12/2009 | Lin et al. ............ 345/419 |
| 2010/0053161 A1 | 3/2010 | Chuter |
| 2010/0076738 A1 * | 3/2010 | Dean et al. ............ 703/7 |
| 2010/0171740 A1 | 7/2010 | Andersen et al. |
| 2010/0214870 A1 | 8/2010 | Pepper et al. |
| 2010/0283788 A1 | 11/2010 | Rothnemer et al. |
| 2011/0029293 A1 | 2/2011 | Petty et al. |
| 2011/0054857 A1 * | 3/2011 | Moguchaya ............ 703/2 |
| 2011/0060572 A1 | 3/2011 | Brown et al. |
| 2011/0074766 A1 | 3/2011 | Page et al. |
| 2011/0107246 A1 | 5/2011 | Vik |
| 2011/0115787 A1 | 5/2011 | Kadlec |
| 2011/0161133 A1 | 6/2011 | Staveley et al. |

FOREIGN PATENT DOCUMENTS

| | | |
|---|---|---|
| EP | 1230566 | 2/2005 |
| WO | 00/14574 | 3/2000 |
| WO | 2008/121950 | 10/2008 |
| WO | 2009/039422 | 3/2009 |
| WO | 2009/148681 | 12/2009 |
| WO | 2011/038221 | 3/2011 |

OTHER PUBLICATIONS

"Enriched finite elements and level sets for damage tolerance assessment of complex structures," Stephane Bordas and Brian Moran, EPFL Institute des Structures, Switzerland, Jan. 2006.*

Callahan, S.P. et al. (2005), "Interactive Rendering of Large Unstructured Grids Using Dynamic Level-of-Detail," Visualization, VIS 05, *IEEE*, pp. 199-206.

Mukhopadhyay, P.K. (2005), "Three-Dimensional Borehole Radar Imaging", Thesis, University of Cape Town, 204 pgs. (Nov. 22, 2005).

* cited by examiner

100

200

SYSTEM AND METHOD FOR OBTAINING A MODEL OF DATA DESCRIBING A PHYSICAL STRUCTURE

CROSS-REFERENCE TO RELATED APPLICATION

This application claims the benefit of U.S. Provisional Patent Application 61/323,144, filed Apr. 12, 2010, entitled SYSTEM AND METHOD FOR OBTAINING A MODEL OF DATA DESCRIBING A PHYSICAL STRUCTURE, the entirety of which is incorporated by reference herein.

FIELD

The present techniques relate to obtaining a model of data describing a physical structure. In particular, an exemplary embodiment of the present techniques relates to providing a model of a subsurface region using enriched finite element modeling (EFEM) techniques.

BACKGROUND

This section is intended to introduce various aspects of the art, which may be associated with embodiments of the disclosed techniques. This discussion is believed to assist in providing a framework to facilitate a better understanding of particular aspects of the disclosed techniques. Accordingly, it should be understood that this section is to be read in this light, and not necessarily as admissions of prior art.

Three-dimensional (3D) model construction and visualization have been widely accepted by numerous disciplines as a mechanism for analyzing, communicating, and comprehending complex 3D relationships. Examples of structures that can be subjected to 3D analysis include the earth's subsurface, facility designs and the human body.

With respect to providing visualizations of data regarding a 3D earth model, the current practices generally relate to processing and visualizing the geological data types such as seismic volumes, a geo-modeling grid, fault surfaces, horizon grids, well data and the like. In addition, it may be desirable to visually represent engineering and geoscience data types, which may be point or non-spatial data. Examples of such data types include drilling information, daily/monthly production data, geochemical or geomechanical analysis results, production measurements or the like.

The addition of time variability into the modeling of earth model data presents a challenging technical problem. A data set that includes 3D earth model data as well as time variability data may be referred to as four-dimensional (4D) data. Known modeling techniques do not include the ability to provide integrated visualizations inclusive of a broad range of earth model data types in 4D visual form.

One method of providing data for visualization includes the use of a numerical technique known as enriched finite element modeling (EFEM). EFEM is a modeling technique that allows effective analysis of localized features such as cracks, faults, fractures or the like that are not efficiently resolved by mesh refinement. In EFEM, a discontinuous basis function may be added to standard polynomial basis functions to allow modeling of discontinuous local events. The modeling of local events may thus be performed without the need to redefine the entire finite element mesh.

One step in the EFEM formulation requires the integration over a cell intersected by discontinuous subsurface features of interest. One method of doing that is to partition the cell according to the subsurface features and then perform integration piece by piece. The cell partition used for integration can also aid visualization. This is because subsurface features usually bring discontinuity in to the solution. To display such a discontinuity, the region on the two sides of the feature needs to be represented differently (for example, with different colors). The existing cell partition used for integration can effectively serve this purpose.

No existing visualization toolkits have been optimized to produce visualizations of the results of EFEM techniques. There are several characteristics of EFEM analysis that contribute to difficulties in providing visualizations. For example, EFEM is typically performed on very large models, such as models having millions of cells. In addition, it is frequently desirable to analyze a large number of time steps, and cells may be partitioned over time. Property definitions may change and span across multiple time steps. Also, the rendering of discontinuities may be made difficult because of the presence of hanging nodes.

Known visualization programs that support any changes to the mesh over time represent the changing mesh as discrete instances, requiring redefinition of the entire mesh at each time step. For example, one known visualization program allows different portions of a model to be activated at different times. Moreover, portions can be loaded to represent all time steps and activated in sequence to produce the effect of showing a mesh that is changing in time. Each portion of the model is redefined and stored independently and there is no attempt to share data between time steps.

U.S. Patent Application Publication No. 20080312887 relates to a software program that supports user directed grid enrichment and flow solution adaptive grid refinement. User selectable options such as the choice of functions, the choice of thresholds, etc., other than a pre-marked cell list, can be entered on a command line. The ease of application is an asset for flow physics research and preliminary design computational fluid dynamics analysis where fast grid modification is often needed to deal with unanticipated development of flow details.

One known visualization approach provides the ability to model dynamic migration in a subsurface region by simulating changes in property values over time. In addition, this application provides simulation of model geometry changes over time. The time changing model geometries also allow for time changing surfaces and pointsets. However, this known application only allows the specification of model geometry, not the specification of associated surfaces and pointsets derived from the model geometry. Moreover, the surfaces and pointsets of the known application cannot be modified or created separately from the model geometry. Further, the known application only allows definition of the model geometry at an initial time. The user is not permitted to make further changes to the model geometry after it is defined. A method that effectively incorporates time-variability into the presentation of visual images of a structure such as a subsurface region is desirable.

U.S. Patent Application Publication No. 20080262809 relates to a method and system for modeling petroleum migration. This application purports to describe a method for modeling the migration of reactant in a subsurface petroleum system. The method comprises in part generating a mesh for an area of the petroleum system. The mesh comprises a plurality of nodes, with each node representing a point in space in the area. The method also comprises calculating one or more variables representing one or more physical characteristics at each node in the area and determining the migration of reactant in the petroleum system based on the one or more variables. The method is alleged to be able to process multiple reactant phases and non-static meshes.

SUMMARY

An exemplary embodiment of the present techniques comprises a method for obtaining a model of data describing a physical structure. An exemplary method comprises defining a 3D object that corresponds to a physical structure. The 3D object comprises a set of topographical elements that each has an initial geometric definition. The exemplary method also comprises creating a subsequent model of the data by updating a subset of the topological elements in the 3D object. Each topological element in the subset of topological elements has a geometric definition that has changed relative to its initial geometric definition.

According to the present techniques, the 3D object may comprise an unstructured grid. The subsequent model may represent a subsequent time relative to the time of the initial geometric definition. In addition, the subsequent model may represent a subsequent pressure scenario.

An exemplary method may comprise changing the geometric definition of each topological element of the subset of topological elements relative to its initial geometric definition. The change in the geometric definition of each topological element of the subset of topological elements may result from a change in a value of a property of interest associated with the topological element.

According to an exemplary embodiment of the present techniques, a key frame corresponding to the subsequent model may be created. The key frame, once defined, requires no reference to data corresponding to any other model definition. In one exemplary embodiment, the key frame may represent an aggregate of a plurality of changesets applied to a model definition or previous key frame.

A visualization of the 3D object may be created. Data corresponding to topological elements that are replaced from an initial model to the subsequent model may be removed from the visualization. An exemplary embodiment of the present techniques may comprise defining the subset of topological elements using an enriched finite element modeling (EFEM) technique.

According to an exemplary embodiment of the present techniques, a changeset of data values for the subset of topological elements may be expressed as at least one unique geometry definition collection that comprises common points, faces and/or cells that have a starting offset to an index corresponding to a final index of data representative of an initial model. In one exemplary embodiment, the subsequent model corresponds to a particular requested time.

One exemplary embodiment of the present techniques relates to a computer system that is adapted to provide a model of data describing a physical structure. An exemplary computer system comprises a processor and a tangible, machine-readable storage medium that stores machine-readable instructions for execution by the processor. The machine-readable instructions may comprise code that, when executed by the processor, is adapted to cause the processor to define a 3D object that corresponds to a physical structure, the 3D object comprising a set of topological elements that each has an initial geometric definition. The machine-readable instructions may also comprise code that, when executed by the processor, is adapted to cause the processor to create a subsequent model of the data by updating a subset of the topological elements in the 3D object, each topological element in the subset of topological elements having a geometric definition that has changed relative to its initial geometric definition.

In an exemplary computer system, the 3D object may comprise an unstructured grid. In addition, the subsequent model may represent a subsequent time.

In an exemplary embodiment of the present techniques, the geometric definition of each of the subset of topological elements may be changed relative to its initial geometric definition. The change in the geometric definition of each topological element of the subset of topological elements may result from a change in a value of a property of interest associated with the topological element.

A frame corresponding to the subsequent model may be defined. Data corresponding to the subset of topological elements may be defined as a difference in the data from an initial model to the subsequent model.

In one exemplary computer system, a key frame corresponding to the subsequent model may be created. The key frame, once defined, requires no reference to data corresponding to any other model definition. A key frame may be created to represent an aggregate of a plurality of changesets applied to a model definition or previous key frame.

An exemplary computer system comprises code that, when executed by the processor, is adapted to cause the processor to create a visualization of the 3D object. Data corresponding to topological elements that are replaced from an initial model to the subsequent model may be removed from the visualization.

One exemplary embodiment of the present techniques relates to a method for producing hydrocarbons from an oil and/or gas field using a model of data describing a physical structure of the oil and/or gas field. An exemplary method comprises defining a 3D object that corresponds to a physical structure of the oil and/or gas field. The 3D object may comprise a set of topological elements that each has an initial geometric definition. A subsequent model of the data may be created by updating a subset of topological elements in the 3D object. Each topological element in the subset of topological elements may have a geometric definition that has changed relative to its initial geometric definition. The exemplary method also comprises extracting hydrocarbons from the oil and/or gas field using the subsequent model.

DESCRIPTION OF THE DRAWINGS

Advantages of the present techniques may become apparent upon reviewing the following detailed description and the accompanying drawings in which.

DETAILED DESCRIPTION

Figure 1:
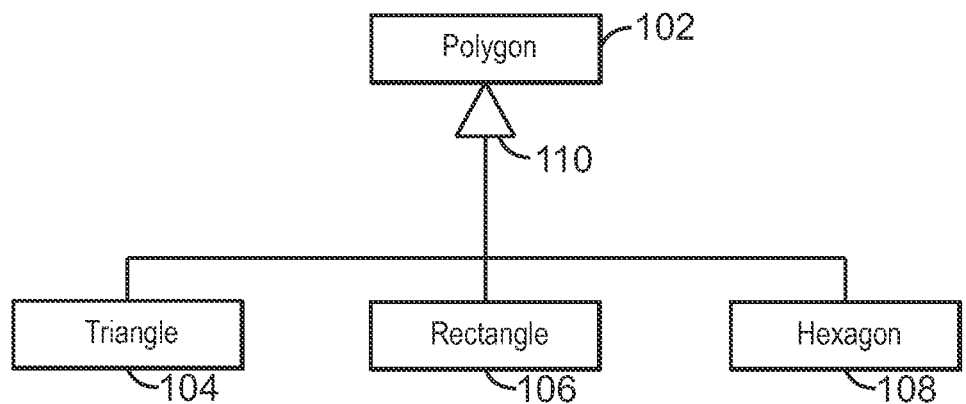
FIG. 1 is a block diagram useful in explaining inheritance in an object-oriented programming environment according to the present techniques.

In the following detailed description section, specific embodiments are described in connection with preferred embodiments. However, to the extent that the following description is specific to a particular embodiment or a particular use, this is intended to be for exemplary purposes only and simply provides a description of the exemplary embodiments. Accordingly, the present techniques are not limited to embodiments described herein, but rather, it includes all alternatives, modifications, and equivalents falling within the spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent.

As used herein, the term "2D polygonset" refers to a collection of two-dimensional (2D) planar faces located in 3D space that may have interior holes. Properties on a 2D polygonset may be used to color the faces.

As used herein, the term "3D seismic data volume" refers to a 3D volume of discrete seismic data points. The three dimensions relate to the spatial characteristics of the earth formation, two being horizontal length dimensions, and the third relating to depth in the earth formation, which can be represented by a length coordinate, or by a time coordinate such as the two-way travel time of a seismic wave from surface to a certain depth and back. In subsurface models, the discrete data points that make up a seismic data volume are often represented by a set of contiguous hexahedrons known as "cells" or "voxels", with each cell or voxel representing the volume surrounding a single data point. Each data point, cell, or voxel in a 3D seismic data volume typically has an assigned value ("data sample") of a specific seismic data attribute such as seismic amplitude, acoustic impedance, or any other seismic data attribute that can be defined on a point-by-point basis. Seismic data may comprise a structured 3D model defined by a point, 3-step vectors and a size in I,J,K space. Seismic data may be visually rendered or texture mapped on a surface with a variety of properties, such as color or opacity, for example.

As used herein, the term "annotation" refers to a chart, text, or primitives used to represent non-spatial data or areas of high interest. By way of example, a chart might be used to denote production data, a textbox may be used to show user comments, or primitives may be used to denote areas of interest to a user.

As used herein, the term "block" as applied to frames refers to a set of frames that includes a key frame and subsequent frames that are defined as change sets relative to the key frame. A new block begins with each key frame.

As used herein, the term "cell" refers to a collection of faces, or a collection of nodes that implicitly define faces, where the faces together form a closed volume.

As used herein, the term "changeset" refers to a completed set of modifications that define a second time step based on a first time step.

As used herein, the term "class" refers to a data structure that combines state (fields) and actions (methods and other function members) in a single unit. A class provides a definition for dynamically created instances of the class, also known as objects. Classes support inheritance and polymorphism mechanisms whereby derived classes can extend and specialize base classes.

As used herein, the term "computer component" refers to a computer-related entity, either hardware, firmware, software, a combination thereof, or software in execution. For example, a computer component can be, but is not limited to being, a process running on a processor, a processor, an object, an executable, a thread of execution, a program, and a computer. One or more computer components can reside within a process and/or thread of execution and a computer component can be localized on one computer and/or distributed between two or more computers.

As used herein, the terms "computer-readable medium" or "tangible machine-readable medium" refer to any tangible storage that participates in providing instructions to a processor for execution. Such a medium may take many forms, including but not limited to, non-volatile media, and volatile media. Non-volatile media includes, for example, NVRAM, or magnetic or optical disks. Volatile media includes dynamic memory, such as main memory. Computer-readable media may include, for example, a floppy disk, a flexible disk, hard disk, magnetic tape, or any other magnetic medium, magneto-optical medium, a CD-ROM, any other optical medium, a RAM, a PROM, and EPROM, a FLASH-EPROM, a solid state medium like a holographic memory, a memory card, or any other memory chip or cartridge, or any other physical medium from which a computer can read. When the computer-readable media is configured as a database, it is to be understood that the database may be any type of database, such as relational, hierarchical, object-oriented, and/or the like. Accordingly, exemplary embodiments of the present techniques may be considered to include a tangible storage medium or tangible distribution medium and prior art-recognized equivalents and successor media, in which the software implementations embodying the present techniques are stored.

As used herein, the term "encapsulation" refers to a characteristic behavior of an object, which is to hide, or encapsulate, the internal structure of the data of the object and the algorithms by which its functions work. Instead of exposing these implementation details, objects present interfaces that represent their abstracts clearly with no extraneous information. The interface allows only a limited number of interactions between the outside world and an object. In C++ programming, most of these interactions involve invoking methods of the object. By invoking an object's methods, the outside world can tell the object to do something, but the details of how the object performs this action are not visible to the outside world. In effect, the object encapsulates its data and methods and hides them from the outside world.

As used herein, the terms "enriched finite element modeling" or "EFEM" refer to a numerical technique that is used to find approximate solutions of partial differential equations and/or integral equations having discontinuous functions.

As used herein, "exemplary" is used herein to mean "serving as an example, instance, or illustration." Any embodiment described herein as "exemplary" is not necessarily to be construed as preferred or advantageous over other embodiments.

As used herein, the term "face" refers to an arbitrary collection of points that form a surface.

As used herein, the term "frame" refers to a set of model data corresponding to a time instance.

As used herein, the term "geologic model" refers to a model that is topologically structured in I,J,K space but geometrically varied. A geologic model may be defined in terms of nodes and cells. Geologic models can also be defined via pillars. A geologic model may be visually rendered as a shell (without volume rendering).

As used herein, the term "grid2D" refers to a 2D structured regularly spaced array of 3D points. X, y values may be calculated as needed from an origin and step vectors. Z values may vary independently and may therefore be stored explicitly. Grid2D data may be rendered as surfaces. Properties may be used to color the surface. Moreover, Grid2D data may appear to be quadrilaterals from above except that special "no values" parameters may be used to prevent certain Grid2D faces from being visually rendered.

As used herein, the term "I,J,K space" refers to a local horizontal reference frame for a geo-cellular model having specified integer coordinates for (I,J,K) for consecutive cells. By convention, k represents a vertical coordinate. I,J,K space may be used as a sample space in which each coordinate represents a single sample value without reference to a physical characteristic.

As used herein, the term "inheritance" refers to a characteristic behavior of an object, which is to allow reuse of pre-existing design and code. Moreover, inheritance allows previously written programs to be broadened by creating new superclasses and subclasses of objects. New objects may be described by how they differ from preexisting objects so that entirely new programs need not be written to handle new types of data or functions. General data and methods belong to a "base" class. More specific classes "inherit" these data and methods and define data and methods of their own. These specific classes are "derived" from the base class.

As used herein, the term "key frame" refers to a frame of model data that is defined independently, or without reference to data corresponding to a previous time instance.

As used herein, the term "mesh" refers to an unstructured grid that is defined for the purpose of analyzing data using a numerical technique such as EFEM.

As used herein, the term "node" refers to a collection of points defining one topological location in I,J,K space. Unless a split or fault condition is associated with the node, nodes have only one point.

The term "object" is used herein in the sense that it is normally understood as a computer science term of art. Thus, "object", refers to a single logical entity that may include a collection of data and methods for processing that data. Some data may be public while other data may be private. Similarly, some methods may be public while other methods may be private. Example methods may include constructors, destructors, get/set methods, and so on. Object-oriented programming (OOP) systems typically contain a large number of objects. An object is said to be an instance of a class of which it is a member. OOP enables objects to model virtually any real-world entity in terms of its characteristics, represented by data, and its behavior, represented by the operations it can perform using the data. In this way, objects can model concrete things like cells in a reservoir simulation and abstract concepts like numbers.

The terms "object-oriented programming" or "OOP" are used herein in the sense that it is normally understood as a computer science term of art. Moreover, the method and model of the present techniques may be implemented using OOP techniques. The most common programming languages for OOP are C, C++, C#, Java or the like. However, the practice of the present techniques is not limited to a particular oop language. The design of oop is well known to those skilled in the art of OOP systems and will only be described generally herein. In an object-oriented program, the focus is primarily on data and secondarily on the functions that access that data, rather than being primarily on functions and secondarily on the data they require. In contrast with a program that is described mainly by procedures with data input to and output from each procedure (such as a program written in FORTRAN or COBOL), an object-oriented program is organized around "objects."

As used herein, the term "path dependent objects" refers to data objects generally of one of two classifications: drilling/production information or reservoir/subsurface information. Path dependent objects may be represented as top and bottom measured depth ranges or specific measured depths. Path dependent objects may be visually rendered as cylinders or disks around a wellbore, and do not typically have individual properties.

As used herein, the term "point" refers to an X,Y,Z location in 3D space.

As used herein, the term "pointset" refers to collections of points, such as data points. Pointsets may be used to represent a fault or horizon. Pointsets may be visually rendered as a fixed scene size or as a pixel. Properties may be used to color the points or to change their size.

As used herein, the term "polyline" refers to an ordering of points. A polyline may be displayed as connected line segments (or cylinders) and may or may not be closed. Properties of polylines may be used to provide color or varying the thickness of the polyline and may be discrete or interpolated between known points.

As used herein, the term "polylineset" refers to a collection of polylines in which properties may be used to color the polylineset and be defined on a per polyline, point, or line segment basis. Polylinesets may represent horizons or faults in the upstream.

As used herein, the term "polymorphism" refers to a characteristic behavior of an object, which is to allow a request to be made of a software component without knowing detailed information about the composition of the software component. According to polymorphism, a software component receives a request and interprets it to determine, according to the variables and data of the software component, how to respond to the request.

As used herein, the term "primitive" refers to a basic geometric shape. Examples of 2D primitives include rectangles, circles, ellipses, polygons, points, lines or the like. Examples of 3D primitives include cubes, spheres, ellipsoids, cones, cylinders or the like.

As used herein, the term "property" refers to data representative of a characteristic associated with different topological elements on a per element basis. Generally, a property could be any computing value type, including integer and floating point number types or the like. Moreover, a property may comprise vectors of value types. Properties may only be valid for a subset of a geometry object's elements. Properties may be used to color an object's geometry. The term "property" may also refer to a characteristic or stored information related to an object. Application of the appropriate definition is intuitive to one skilled in the art of computer science.

As used herein, the term "seismic lines" refers to ordered lists of points used to define a path inside a 2D scene and extruded vertically to some specified height. Seismic line data may be visually rendered as a 2D ribbon. Seismic lines have a property defined at uniform intervals down an extrusion for each point.

As used herein, the term "simulation model" refers to an unstructured grid with collections of points, faces and cells.

As used herein, the term "triangulated surface" refers to a collection of points and triangles (the indices of three points in a collection of points). Triangulated surfaces may be visually rendered as surfaces. Properties may be used to color the surface.

As used herein, the term "topological elements" refers to the building blocks of an object. Points, faces, or cells are the most common examples.

As used herein, the term "unstructured grid" refers to a collection of cells with arbitrary geometries. Each cell can have the shape of a prism, hexahedron, or other more complex 3D geometries. When compared to structured grids, unstructured grids can better represent actual data since unstructured grids can contain finer (i.e., smaller) cells in one area, and coarser (i.e., larger) cells elsewhere. This flexibility allows the unstructured grid to represent physical properties better than structured grids. However, all cell geometries need to be stored explicitly, thus an unstructured grid requires a substantial amount of memory. Unstructured grids typically are used with reservoir simulation models and/or geologic models. Note that the term unstructured grid relates to how data is defined and does imply that the data itself has no structure. For example one could represent a seismic model as an unstructured grid with explicitly defined nodes and cells. The result would necessarily be more memory intensive and inefficient to process and visualize than the corresponding structured definition.

As used herein, the term "unstructured surface" refers to a collection of points and polygonal faces. Unstructured surfaces may be visually rendered as surfaces. Properties may be used to color the surface.

As used herein, the terms "update", "updates", or "updating" as applied to cells in an unstructured grid refer to changes to the geometries of cells comprising the unstructured grid, additions of cells to the unstructured grid, and/or deletions of cells from the unstructured grid.

As used herein, the terms "visualization engine" or "VE" refer to a computer component that is adapted to present a model and/or visualization of data that represents one or more physical objects.

As used herein, the term "well" refers to a surface location with a collection of wellbores. Wells may be visually rendered as a point or a glyph, along with a name.

As used herein, the term "wellbore" refers to a constituent underground path of a well and associated collections of path dependent data. A wellbore may be visually rendered as a collection of connected line segments or curves. Wellbores may also be visually rendered cylindrically with a radius.

As used herein, the term "welllog" refers to a collection of measured depth and value pairs along a wellbore. Welllog data may be visually rendered as coloration along a wellbore or as a separate line segment some distance from the path of the wellbore.

Some portions of the detailed description which follows are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions using the terms such as "defining", "processing", "computing", "obtaining", "predicting", "providing", "updating", "comparing", "creating", "determining", "adjusting", "changing", "replacing", "using", "storing", or the like, refer to the action and processes of a computer system, or similar electronic computing device, that transforms data represented as physical (electronic) quantities within the computer system's registers and memories into other data similarly represented as physical quantities within the computer system memories or registers or other such information storage, transmission or display devices. Example methods may be better appreciated with reference to flow diagrams.

While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various serially occurring actions, it is to be appreciated that various actions could occur concurrently, substantially in parallel, and/or at substantially different points in time.

Exemplary embodiments of the present technique address difficulties in providing visualizations of results of EFEM analyses by allowing the ability to redefine unstructured grid geometry over time. Moreover, the definition of model time instances may be expressed as change sets relative to a previous time instance. The ability to express subsequent time instances in terms of changes from a previous time instance obviates the need to store and render a solution for each time instance definition.

In addition, a key frame may be defined at any given time instance to indicate that the key frame time instance definition is independent of previous time instances. The ability to define key frame time instances allows a user or a VE to redefine all cells of an unstructured grid when management of cell properties in terms of changes from a previous time instance becomes unproductive from a standpoint of computational efficiency.

An exemplary embodiment of the present techniques relates to a visualization engine or VE that is adapted to model and/or display complex 4D data produced by an EFEM analysis in a useful way. A VE according to an exemplary embodiment of the present techniques may provide the ability to incorporate new and existing 4D workflows and to visualize results in a common environment. In addition, an exemplary embodiment of the present techniques may provide 4D support for upstream data types in a single modeling and/or visualization environment.

An exemplary embodiment of the present techniques is not necessarily adapted to provide simulations of data or to predict changes in data. A VE according to an exemplary embodiment of the present techniques may use many different geometry data types at various times in a common way. In addition, a VE according to an exemplary embodiment of the present techniques may be adapted to provide interpolation between time steps to create a smooth animation of 4D data.

Interpolation between properties and geometry with a constant topology (i.e. Constant number of points, faces, cells, etc) can be done in a variety of ways most intuitively via linear interpolation of value or location (which ever is applicable) over time. Various mechanisms for supporting topology change animation can be employed like fade in/out of the inconsistent elements or specialized coloring. The object-oriented programming concept of inheritance is used to provide a VE according to an exemplary embodiment of the present techniques.

Object oriented programming may be used to create a VE according to an exemplary embodiment of the present techniques. Accordingly, a brief overview of object oriented programming is set forth herein with respect to FIG. 1 and FIG. 2.

FIG. 1 is a block diagram useful in explaining inheritance in an object-oriented programming environment according to the present techniques. The diagram is generally referred to by the reference number 100.

In the example shown in FIG. 1, inheritance is illustrated using classes that implement three types of polygons. For this example, a polygon can be a triangle, rectangle, or hexagon. Referring to FIG. 1, these three polygons can be implemented using a base class called polygon 102 and three derived classes called triangle 104, rectangle 106, and hexagon 108. A small triangle 110 in FIG. 1 indicates that the classes below it inherit from the class above it.

As illustrated in FIG. 1, a Polygon 102 can be a Triangle 104, a Rectangle 106, or a Hexagon 108. Regardless of which it is, each object may have associated properties such as an "area" and a "color". Accordingly, the base class Polygon 102 contains data items called area and color. The three derived classes (the Triangle 104, the Rectangle 106, and the Hexagon 108) inherit these data items from the base class, Polygon 102.

Furthermore, methods that are the same for the three derived classes can be in the base class. For example, a base class method can define the data items "area" and "color", allocate memory for them, and initialize them. However, the area computation is different for each of the three types of polygon, so each derived class must provide its own method for this computation. Thus, Triangle 104, Rectangle 106, and Hexagon 108 each override a polygon method called compute area that performs the operations required to compute its area, whatever these operations are. The outside world then could contain, for example, an array of Polygon objects, of which some are triangle objects, some are Rectangle objects, and some are Hexagon objects. It could get the area of each of these objects by asking it to compute area. To obtain a particular polygon's area, the outside world would not have to know how it computed its area. In fact, the outside world would not need to know what kind of polygon it was.

Figure 2:
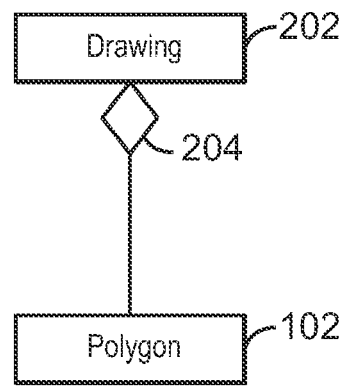
FIG. 2 is a block diagram useful in explaining containment in an object-oriented programming environment according to the present techniques.

FIG. 2 is a block diagram useful in explaining containment in an object-oriented programming environment according to the present techniques. The block diagram is generally referred to by the reference number 200. As shown in FIG. 2, objects in an object-oriented programming environment according to the present techniques may contain other objects or collections of objects. Moreover, a drawing object may contain one or more polygon objects of the class Polygon 102 described above with respect to FIG. 1.

In FIG. 2, a Drawing class 202 aggregates the Polygon class 102. A drawing could be implemented as an object that is an instance of the Drawing class 202. A diamond 204 indicates that an object of one class, Drawing 202, may contain a collection of an undefined number of objects of another class, Polygon 102. The number of Polygon 102 objects allowed would be zero or more, because the Drawing class 202 should not be required to contain a polygon.

For an object, the outside world is the application's higher-level code that uses the object to accomplish its objectives. Encapsulation, polymorphism, and inheritance allow the higher-level code to handle objects that are similar but not identical in type as if they actually were identical in type. This greatly simplifies higher-level code, making it practical to write code that performs more complex operations than are practical with a procedural language.

Figure 3:
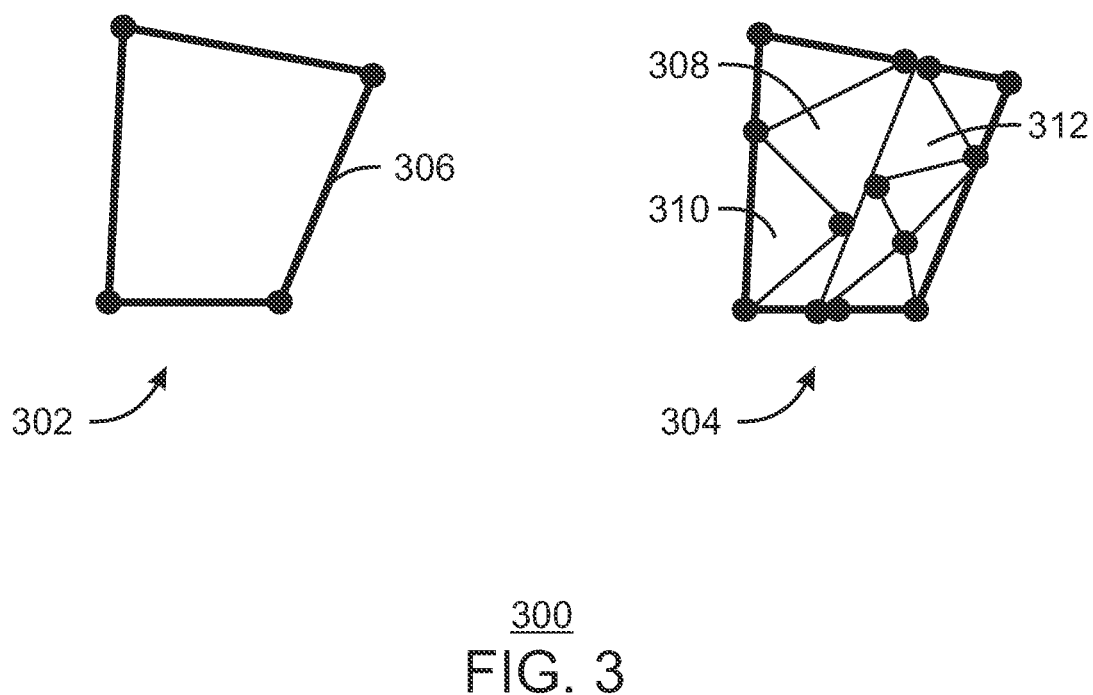
FIG. 3 is a diagram showing a portion of an unstructured grid at an initial time and at a subsequent time according to exemplary embodiments of the present techniques.

FIG. 3 is a diagram showing a portion of an unstructured grid at an initial time and at a subsequent time according to exemplary embodiments of the present techniques. The diagram is generally referred to by the reference number 300. The diagram 300 includes a left panel 302 and a right panel 304. The left panel 302 represents a cell 306 of an unstructured grid at an initial time t0. The cell 306 is defines a region of a 3D volume in which a property of interest (for example, porosity) has a common or uniform value, or at least a value that is within a preset range.

The right panel 304 shows the 3D volume previously defined as the cell 306, but at a later time, t10. Moreover, in the right panel 304, the volume previously defined as the cell 306 is fractured into a plurality of cells defined by the vertices shown in the right panel 304. The cells in the right panel 304 include cells 308, 310 and 312. The cells 308, 310 and 312 each represent a 3D volume for which a property of interest (for example, porosity) has a common or uniform value, or at least a value that is within a preset range.

The change in cell configuration from time t0 to time t10 may be reflect the occurrence of a discontinuous event such as a fracture or the like. According to exemplary embodiments of the present technique, the definition of cells 308, 310 and 312 in the right panel 304 results in the application of an EFEM technique to data represented by the cell 306 in the left panel 302. Moreover, the EFEM technique may model the effect of a discontinuous event such as a fracture occurring a region adjacent to a wellbore. As explained in detail below, exemplary embodiments of the present technique relate to providing a visualization of data corresponding to the cell 306 at time t0 and the cells shown in the right panel 304, including the cells 308, 310 and 312, at time t10.

An exemplary embodiment of the present technique provides the ability to visualize data resulting from EFEM techniques by exploiting the fact that, in a model that comprises a relatively large unstructured grid, changes of data that are to be visualized may occur in a relatively small number of cells from one time step to the next. Thus, computational efficiency is achieved relative to a system that wholly redefines a visualization of an entire unstructured grid for each successive time step.

In one exemplary embodiment, a first key frame of visualization data is defined and data corresponding to a subset of cells of an unstructured grid for which data changes is represented as change steps in subsequent frames of visualization data corresponding to subsequent time steps relative to the first key frame of visualization data. Visualization data for portions of the grid that do not change between time steps are unchanged, or may be represented as a change step of zero. Data for properties may change at a higher or lower granularity than the cell geometry.

The data stored in the change sets may represent new geometric definitions of cells that are created because of a discontinuous event such as a crack, fracture or the like. Moreover, a single cell in one frame of data may be subdivided into a plurality of cells in subsequent frames to more accurately model relatively fast changes in a small portion of the grid using EFEM techniques, as explained herein with reference to FIG. 3. In addition, the change set data may also include new property values for each cell represented by the new geometric definitions. Exemplary embodiments of the present techniques relate to numerically updating an unstructured grid to incorporate changes to cell geometry and data representing properties of interest as a modeling process is performed.

In providing visualizations of data, a frame of data may be rendered in its entirety as an initial matter. Updates based on subsequent time steps may draw only cells, whether existing in the previous frame or newly created based on a technique such as EFEM, whose data values are new (for a newly defined cell) or changed relative to the previous time step. According to an exemplary embodiment of the present technique, an alpha channel may be used to mask portions of the previously drawn cell that are to be redrawn with new or changed data representative of a subsequent time step. By rendering only portions of a frame that have changed relative to a previous time step, the speed of updating visualizations of a 3D region may be improved.

Periodically, a new key frame of visualization data, which is not dependent on previous frames of visualization data may be defined. Moreover, the new key frame is not defined as a change set relative to a previous frame of visualization data. By way of example, a new key frame may be defined when computational overhead associated with managing the visualization of frames defined as change sets relative to a previous frame exceeds a threshold. This approach may provide beneficial technical effects of conserving disk storage space and making feasible EFEM visualization in a computing system employing a 32-bit memory architecture.

A new key frame may be determined by a user or in programming by a VE according to the present techniques. Moreover, a VE may include heuristics that determine when computational overhead may be reduced by defining a new key frame.

Exemplary embodiments of the present technique may employ function calls according to a particular application programming interface (API) to manipulate unstructured grid data. Examples of such function calls include an AddPoint( . . . ) function call, an AddFace( . . . ) function call, or an AddCell( . . . ) function call, to name just a few examples. Each of these function calls may return an index of a point, face, or cell that was just added. A Finalize( ) function call may be employed to indicates that the model is fully defined for a given time step.

In change set creation, a VE may employ function calls such as the function calls described herein, but the initially returned indices may be greater than zero. Additional API calls such as a RemovePoint(int index) function call, a RemoveFace(int index) function call, or a RemoveCell(int index) function call may also be provided to denote the previous topologies not valid for the current time instance. Finally, a FinalizeAsKeyFrame( ) function call or method may be provided to allow a client to specify to the VE when a new key frame should be defined instead of continuing to rely on time step definitions expressed as change sets relative to previous time step data. When a key frame is finalized, geometry data may be duplicated in exchange for the ability to cache all previous time step definitions to disk.

Using the function calls herein, a workflow according to an exemplary embodiment of the present technique may be provided. Such a workflow may include a client providing a VE with full a unstructured grid geometry definition at time n using general add methods described herein. The client may finalize data corresponding to a time step and may visualize or interact with the results at their discretion. The client may then provide definitions of changes to the model at time n+1. Using add or remove methods, as described herein, the client may again finalize and interact with the model data for the resulting time steps viewing them in any desired order. These steps may be repeated, as desired.

At any point, model data for a current time step may be defined as a new key frame. Key frame finalization redefines the current time step wholly independently of previous time step data.

As set forth herein, a client can interact and visualize all defined time steps after a time step is finalized. Furthermore, the time step definitions can be referenced by the client via the change set description or via point, face, and cell accessors that treat each time step as one uniform and consistent geometry without knowledge of the underlying change sets.

According to an exemplary embodiment of the present techniques, a set of API calls may be employed to allow a VE to expose block definition calls that allows the client to define the size of all the time steps in a block prior to the actual definition of the time steps. The usefulness of this feature may be appreciated with reference to the example below.

The behavior of a VE toolkit with regards to exemplary embodiments of the present techniques may vary based on individual system design criteria. Moreover, such behavior may include providing an API that allows a client to define new steps as change sets instead of redefining the entire unstructured grid geometry for each time step. The definition of each time step may be stored in a way that prevents duplication of grid data. Clients may treat each time step as though it is independent from previous time steps. Resulting 3D objects may be visualized in a way the takes advantage of shared grid definitions across time steps to improve performance.

Those of ordinary skill in the art will appreciate that process of defining an unstructured grid varies widely depending on the toolkit. In general, existing object creation paradigms may be followed as much as possible. Initial unstructured grid definition may include object creation. In addition, point, face, and cell definition may take place, as well as object finalization. The first call added for change set support may comprise an object time-instance's creation mechanism that indicates that it is to be defined as a change set from the previous time step definition.

Other function calls to support change set definition may include the Remove( ) method and the FinalizeAsKeyFrame( ) method. In an exemplary embodiment, a FinalizeAsKeyFrame( ) method may freshly define the whole object geometry to allow the client to define time steps in a uniform way throughout simulation and to treat client-specified key frame definition as an optimization detail that can be added at any time.

Exemplary embodiments of the present technique may employ many potential ways to prevent duplication and to allow time instances to be treated independently of grid definition. As one example, assume that time step n is fully and independently defined (i.e., n is a key frame). For simplification, it may be further assumed that the definition is a collection of points and a collection of face definitions based on the points and a collection of cell definitions based on the faces. Under these assumptions, when a client defines time step n+1 to be based on time step n, function calls may be made to a remove( ) method to provide the list of no longer valid points, faces, and cells.

When the Remove( ) calls are completed, a VE may create a map that allows the client to treat the remaining points, faces, and cells as consistent, non-sparse collections (i.e., if there are X number of faces, then the maximum index of a face is X-1 and there are no duplicates). Accordingly, the client can add the remaining point, face, and cell definitions where the indices are returned as though they were appended to the end of the pre-existing non-sparse collection.

A subsequent call by the client to a Finalize( ) method indicates that the time-instance's geometry is now fully defined. The client then can treat the new time-instance as if it were a completely independently defined time instance for all purposes. This technique may provide significant memory savings. Moreover, efficient memory usage may be achieved by removing the constraint that each time instance is to be viewed as completely independent. The removal of this constraint allows the removal of the overhead associated with the map creation. Those of ordinary skill in the art may recognize various other tradeoffs that could be made between memory and data access efficiency.

As noted herein, an exemplary embodiment of the present techniques may provide the ability to visualize 3D objects in a manner that takes advantage of shared grid definitions across time steps. This may be achieved by using key frames. By way of example, when the client has an entire block definition in advance, the VE can allocate perfectly sized vertex arrays for data, as well, as polygon, property, color arrays or the like, which may be treated similarly. Each time step may append its vertices to the vertices of a prior time step in a vertex array. API calls may be employed to provide block size information. Alternatively, the VE can heuristically determine the ideal block size and key frame definitions when an initial rendering is to be performed.

When an entire block is not initially known, such as when data is to be rendered as it is made available to the VE, a dynamic vertex buffer object may be allocated with some factor of extra space relative to the space needed for a key frame. This factor can be tuned for different data sets. As additional frames are added and the vertex buffer object becomes full, additional vertex buffers can be allocated to accommodate the remaining vertices of the block.

When model data corresponding to a particular time step is to be rendered as a visualization, needed vertices and polygons may be made available in vertex buffer memory. The polygons not active in a particular time step may be assigned an alpha value of zero, making them invisible, and allowing the co-located polygons to be shown in those areas instead. Switching back and forth between time instances within a block defined by vertex buffers in memory may be performed by swapping alpha maps and can be done relatively quickly. In the case where subsequent time step rendering employs data in additional vertex buffers, those vertex buffers may contain change set data and may therefore be loaded on demand. This may result in faster performance relative to loading the entire grid definition for that time step. When transitioning between blocks may result in a cost in terms of computational performance. This cost may be approximately equivalent to the render time of an initial time step.

The present techniques relate to a VE that provides models and/or visualizations of objects in a 4D environment. Such a VE may provide models and/or visualizations of 3D data as it changes through time. One exemplary VE is adapted to provide models and/or visualizations of data that is useful in performing upstream activities in the oil and gas industry. Such an exemplary VE is adapted to provide time-aware models and/or visualizations of pointsets, polylines, polylinesets, 2D polygonsets and the like. Moreover, these models and/or visualizations may represent a portion of a subsurface environment as it changes over time. Such models and/or visualizations may comprise renderings of data types such as well data, wellbore data, welllog data or other path dependent objects.

A VE according to the present techniques may provide models and/or visualizations of Grid2D data, triangulated surface data, unstructured surface data or the like. Models and/or visualizations of seismic data and/or seismic line data may also be provided. Models and/or visualizations provided in accordance with the present techniques may also include non-seismic 3D model data such as geologic model data and/or simulation model data. A VE according to the present techniques may additionally provide models and/or visualizations of properties associated with objects and may display data using selected regions and/or filtering. In addition, models and/or visualizations of annotations and primitives may be provided. Those of ordinary skill in the art will appreciate that the objects listed herein are for purposes of example only and do not constitute an exhaustive or complete list of the object that may be provided with time-aware modeling/visualization support according to the present techniques. In addition, one advantage provided according to the present techniques is that application development efforts are simplified through the use of polymorphism and automatic synchronization of disparate object time data in a single view.

According to the present techniques, an object-oriented programming environment integrates time-awareness as a property of a wide range of data objects. This integration of time-awareness allows a VE to provide time-aware models/visualizations of upstream data in an unprecedented manner. Moreover, a user is not required to build specific time-aware use cases outside the environment provided by a VE according to the present techniques. In particular, a VE in accordance with the present techniques provides a time object that may be used to provide time-aware models/visualizations of any object in the associated object-oriented programming environment. An exemplary time object provides the ability to update visualizations at practically any interval, ranging from less than one second to one billion years or more. Such a time range allows the creation of flexible types of workflows. In addition, standard time agnostic visualization support may be provided with limited time-related overhead.

In one exemplary VE according to the present techniques, the time-awareness of the VE comprises a broad time range and with precision support. Such an exemplary VE may support time intervals of less than a second, which allows for fracture simulation. The exemplary VE may also support time ranges over billions of years. Moreover, a VE according to an exemplary embodiment of the present techniques is easily able to provide support for time ranges of virtually any size based on the available data.

An exemplary VE may provide improved methods of synchronizing time data in a viewer that displays 3D objects. The viewer time may be specified by a client and each domain object in the viewer may be automatically modeled and/or visualized at the specified time. No client synchronization is required. The client may have the ability to override a particular display of an object to show a time other than the viewer time in order to model/visualize multiple time instances of an object in the same viewer. Associated dependent object data also automatically synchronizes in the viewer (for example, properties, regions, and filters automatically conform to the appropriate time). One workflow enhanced greatly by this synchronization is automatic synchronization of time-aware annotations (for example, pie charts) in the 3D viewer. This ability allows a user to easily view production information across a reservoir at a given time.

A synchronized viewer time also allows components external to an exemplary VE to easily synchronize their view with the viewer time to present a common snapshot of time to users in a client application. This is most commonly done with respect to 2D charts. For example, the client application might be adapted to show a chart with time on the x-axis in synchronization with the corresponding annotations in the 3D viewer.

Another feature that can be enabled in a VE according to the present techniques is the uniform application of an algorithm across multiple time instances. As an example, this would easily allow for uniform smoothing to all time instances of a property.

Those of ordinary skill in the art will appreciate that exemplary embodiments of the present technique, may allow changes to model data to be stored and indexed by a variable other than time. By way of example, a sequence of results related to applying varying amounts of pressure to a 3D object may be achieved. In general, an exemplary embodiment of the present technique may be applied to any intensive calculation that modifies large geometry types at non-interactive rates.

Figure 4:
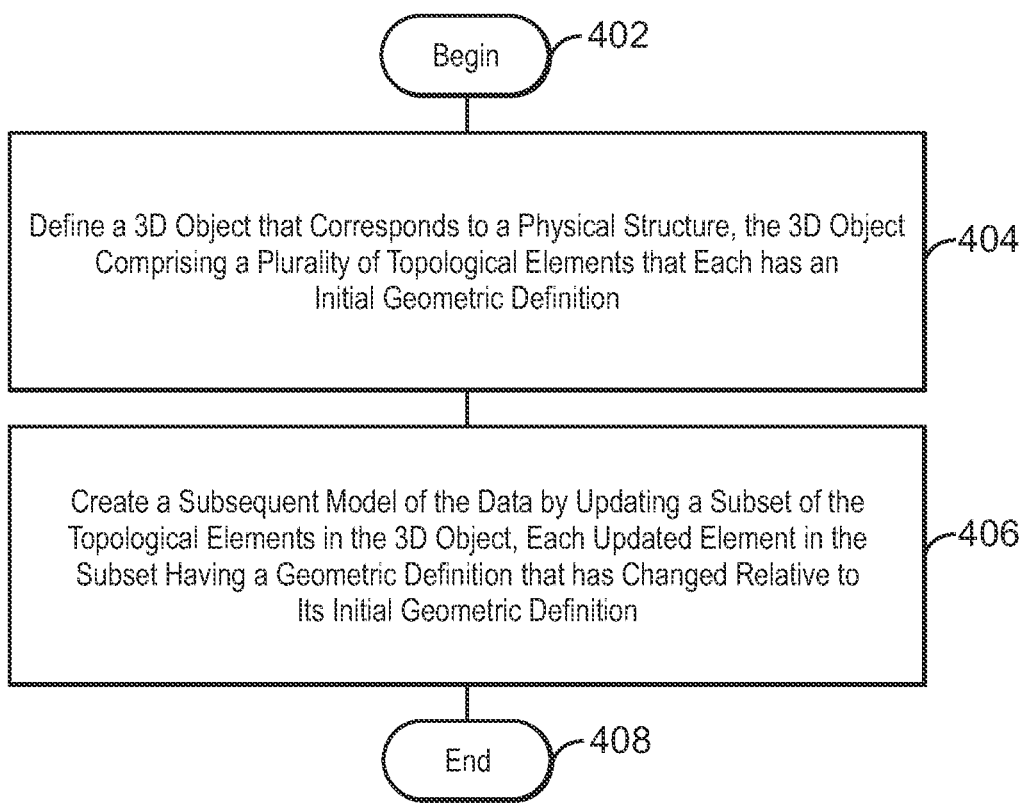
FIG. 4 is a process flow diagram showing a method for obtaining a model of data describing a physical structure according to exemplary embodiments of the present techniques.

FIG. 4 is a process flow diagram showing a method for obtaining a time-based model of data describing a physical structure according to exemplary embodiments of the present techniques. The process is generally referred to by the reference number 400. The process 400 may be executed using one or more computer components of the type described below with reference to FIG. 6. Such computer components may comprise one or more tangible, machine-readable medium that stores computer-executable instructions. The process 400 begins at block 402.

At block 404, a 3D object that corresponds to a physical structure is defined. As described herein, the 3D object comprises a set of topological elements that each has an initial geometric definition.

At block 406, a subsequent model is created by updating a subset of the topological elements in the 3D object. Each updated topological element in the subset of topological elements has a geometric definition that has changed relative to its initial geometric definition. Moreover, only the topological elements for which the geometric definition has changed are included in the subset. The change may relate to a value of a property of interest represented by the topological elements of the 3D object. In particular, the values of the property of interest for the subset of topological elements may change as a result of a time-based simulation process. Changes to geometry are made to facilitate the simulation process. The process ends, as shown at block 408.

Figure 5:
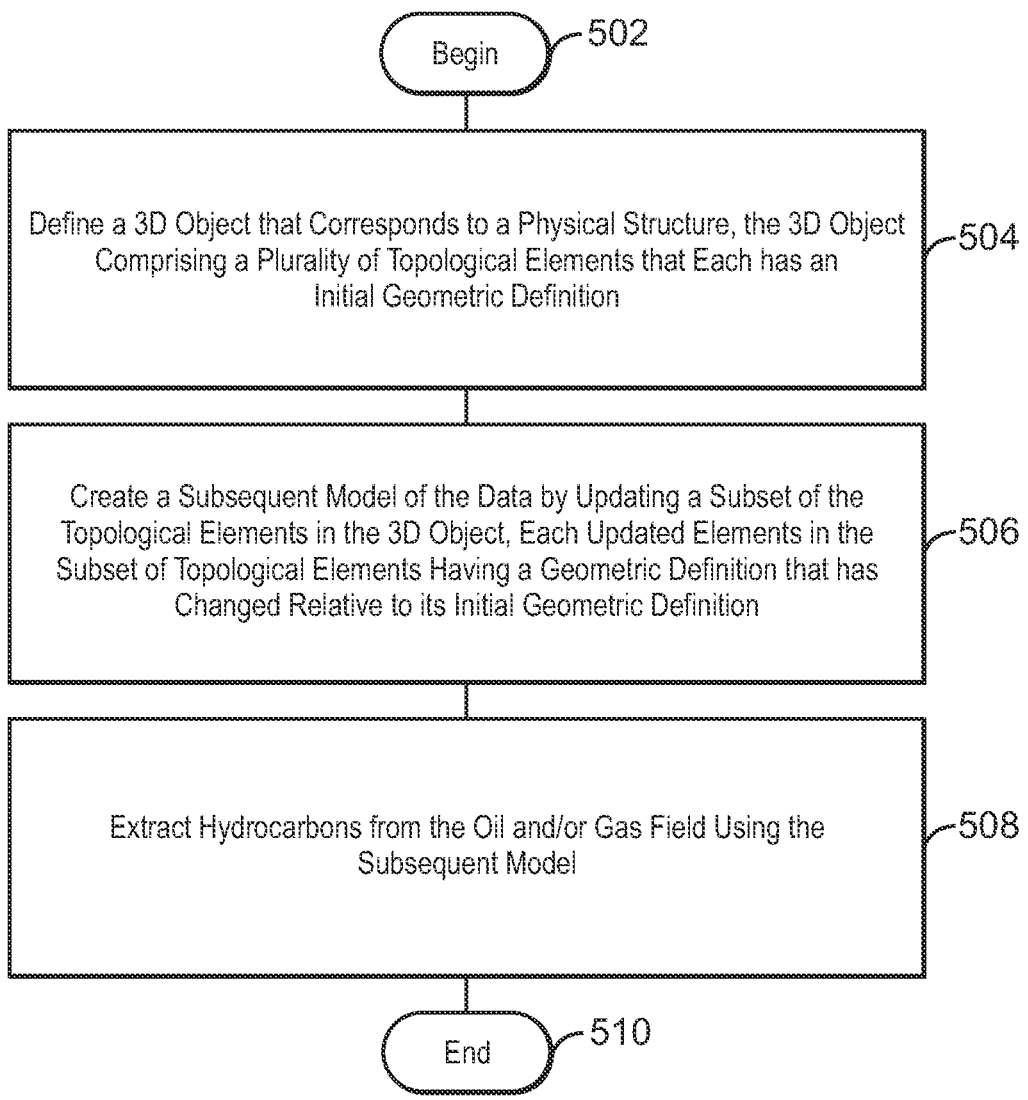
FIG. 5 is a process flow diagram showing a method for producing hydrocarbons from an oil and/or gas field according to exemplary embodiments of the present techniques.

FIG. 5 is a process flow diagram showing a method for producing hydrocarbons from an oil and/or gas field according to exemplary embodiments of the present techniques. The process is generally referred to by the reference number 500. Those of ordinary skill in the art will appreciate that a VE according to the present techniques may facilitate the production of hydrocarbons by producing time-based models and/or visualizations that allow geologists, engineers and the like to determine a course of action to take to enhance hydrocarbon production from a subsurface region. By way of example, a 4D visualization produced according to an exemplary embodiment of the present techniques may allow an engineer or geologist to determine well properties in case of a fracture near a wellbore. The visualization and underlying time-based model data may be used to increase production of hydrocarbons from a subsurface region. At block 502, the process begins.

At block 504, a 3D object that corresponds to a physical structure of the oil and/or gas field is defined. In an exemplary embodiment, the 3D object comprises a set of topological elements that each has an initial geometric definition. At block 506, a subsequent model of the data is created by updating a subset of the topological elements in the 3D object. Each updated element in the subset of topological elements has a geometric definition that has changed relative to its initial geometric definition. At block 508, hydrocarbons are extracted from the oil and/or gas field using the subsequent model. In an exemplary embodiment, visualizations of the data may be produced. The process ends, as shown at block 510.

Figure 6:
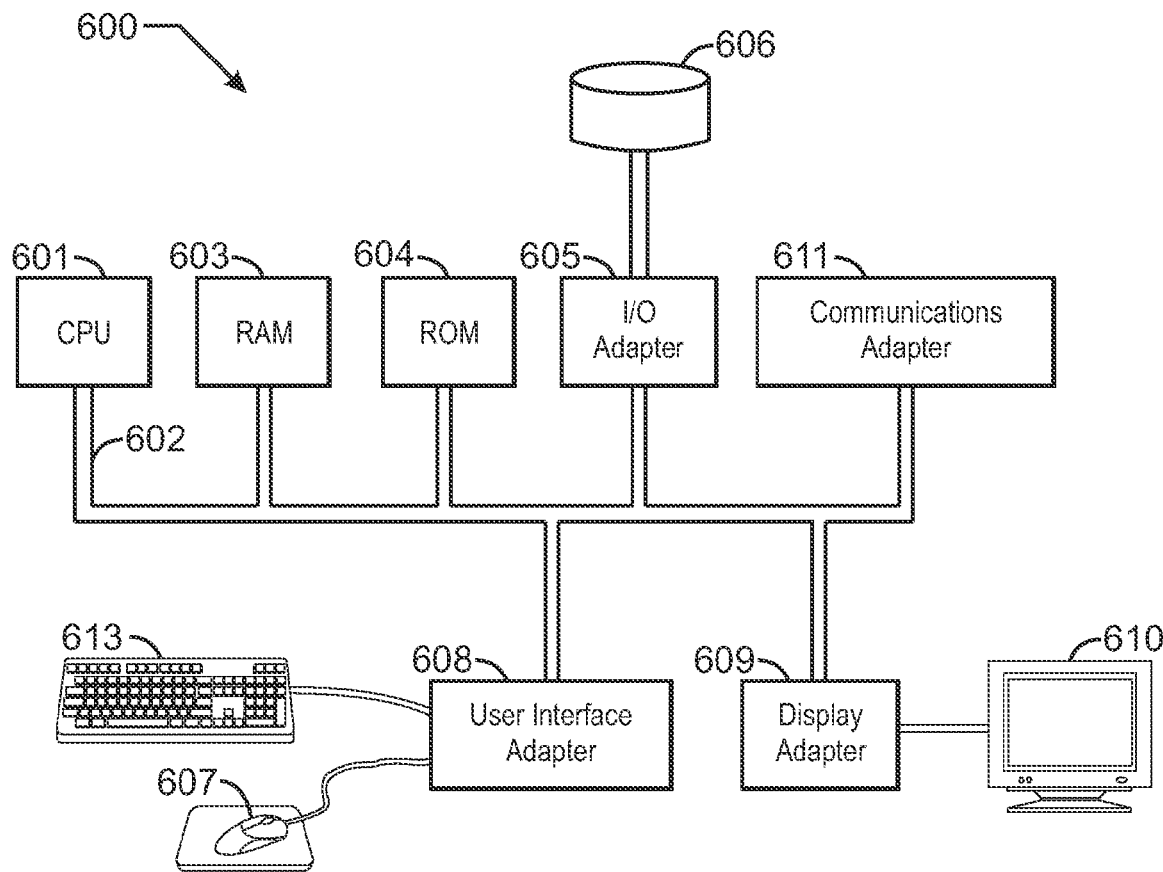
FIG. 6 is a block diagram of a computer system that may be used to perform a method for obtaining a model of data describing a physical structure according to exemplary embodiments of the present techniques.

FIG. 6 is a block diagram of a computer system that may be used to perform a method for obtaining a model of data describing a physical structure according to exemplary embodiments of the present techniques. A central processing unit (CPU) 601 is coupled to system bus 602. The CPU 601 may be any general-purpose CPU, although other types of architectures of CPU 601 (or other components of exemplary system 600) may be used as long as CPU 601 (and other components of system 600) supports the inventive operations as described herein. The CPU 601 may execute the various logical instructions according to various exemplary embodiments. For example, the CPU 601 may execute machine-level instructions for performing processing according to the operational flow described above in conjunction with FIG. 4 or FIG. 5.

The computer system 600 may also include computer components such as computer-readable media. Examples of computer-readable media include a random access memory (RAM) 603, which may be SRAM, DRAM, SDRAM, or the like. The computer system 600 may also include additional computer-readable media such as a read-only memory (ROM) 604, which may be prom, EPROM, EEPROM, or the like. RAM 603 and ROM 604 hold user and system data and programs, as is known in the art. The computer system 600 may also include an input/output (I/O) adapter 605, a communications adapter 611, a user interface adapter 608, and a display adapter 609. The I/O adapter 605, the user interface adapter 608, and/or communications adapter 611 may, in certain embodiments, enable a user to interact with computer system 600 in order to input information.

The I/O adapter 605 preferably connects a storage device(s) 606, such as one or more of hard drive, compact disc (CD) drive, floppy disk drive, tape drive, etc. to computer system 600. The storage device(s) may be used when RAM 603 is insufficient for the memory requirements associated with storing data for operations of embodiments of the present techniques. The data storage of the computer system 600 may be used for storing information and/or other data used or generated as disclosed herein. User interface adapter 608 couples user input devices, such as a keyboard 613, a pointing device 607 and/or output devices to the computer system 600. The display adapter 609 is driven by the CPU 601 to control the display on a display device 610 to, for example, display information or a representation pertaining to a portion of a subsurface region under analysis, such as displaying a generated 4D visual representation of a target area, according to certain exemplary embodiments.

The architecture of system 600 may be varied as desired. For example, any suitable processor-based device may be used, including without limitation personal computers, laptop computers, computer workstations, and multi-processor servers.

Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

The present techniques may be susceptible to various modifications and alternative forms, and the exemplary embodiments discussed above have been shown only by way of example. However, the present techniques are not intended to be limited to the particular embodiments disclosed herein. Indeed, the present techniques include all alternatives, modifications, and equivalents falling within the spirit and scope of the appended claims.

What is claimed is:

1. A computer implemented method for obtaining a model of data describing a physical structure, the method comprising:
    defining a three-dimensional (3D) object that corresponds to a physical structure, the 3D object comprising a set of topological elements that each has an initial geometric definition;
    defining a subset of topological elements, which is less than an entirety of the set of topological elements, using an enriched finite element modeling (EFEM) technique; and
    using a computer to create a subsequent model of the data by updating the subset of the topological elements defined using the EFEM technique in the 3D object, each updated topological element in the subset of topological elements having a geometric definition that has changed relative to its initial geometric definition.

2. The method recited in claim 1, wherein the 3D object comprises an unstructured grid.

3. The method recited in claim 1, wherein the subsequent model represents a subsequent time.

4. The method recited in claim 1, wherein the subsequent model represents a subsequent pressure scenario.

5. The method recited in claim 1, comprising changing the geometric definition of each topological element of the subset of topological elements relative to its initial geometric definition.

6. The method recited in claim 1, comprising changing the geometric definition of each topological element of the subset of topological elements as a result of a change in a value of a property of interest associated with the topological element.

7. The method recited in claim 1, comprising defining a frame corresponding to the subsequent model, wherein data corresponding to the subset of topological elements is defined as a difference in the data from an initial model to the subsequent model.

8. The method recited in claim 1, comprising creating a key frame corresponding to the subsequent model; the key frame, once defined, requires no reference to data corresponding to any other model definition.

9. The method recited in claim 1, comprising creating a key frame that is an aggregate of a plurality of changesets applied to a model definition or previous key frame.

10. The method recited in claim 1, comprising creating a visualization of the 3D object.

11. The method recited in claim 10, wherein data corresponding to topological elements that are replaced from an initial model to the subsequent model are removed from the visualization.

12. The method recited in claim 1, comprising storing a changeset of data values for the subset of topological elements expressed as at least one unique geometry definition collection that comprises common points, faces and/or topological elements that have a starting offset to an index corresponding to a final index of data representative of an initial model.

13. The method recited in claim 1, wherein the subsequent model corresponds to a particular requested time.

14. A computer system that is adapted to provide a model of data describing a physical structure, the computer system comprising:
    a processor; and
    a tangible, machine-readable storage medium that stores machine-readable instructions for execution by the processor, the machine-readable instructions comprising:
        code that, when executed by the processor, is adapted to cause the processor to define a three-dimensional (3D) object that corresponds to a physical structure, the 3D object comprising a set of topological elements that each has an initial geometric definition;
        code that, when executed by the processor, is adapted to cause the processor to define a subset of topological elements, which is less than an entirety of the set of topological elements, using an enriched finite element modeling (EFEM) technique; and
        code that, when executed by the processor, is adapted to cause the processor to create a subsequent model of the data by updating the subset of the topological elements defined using the EFEM technique in the 3D object, each updated topological element in the subset of topological elements having a geometric definition that has changed relative to its initial geometric definition.

15. The computer system recited in claim 14, wherein the 3D object comprises an unstructured grid.

16. The computer system recited in claim 14, wherein the subsequent model represents a subsequent time.

17. The computer system recited in claim 14, wherein the geometric definition of each topological element of the subset of topological elements is changed relative to its initial geometric definition.

18. The computer system recited in claim 14, wherein the geometric definition of each topological element of the subset of topological element is changed as a result of a change in a value of a property of interest associated with the topological element.

19. The computer system recited in claim 14, wherein a frame corresponding to the subsequent model is defined, wherein data corresponding to the subset of topological elements is defined as a difference in the data from an initial model to the subsequent model.

20. The computer system recited in claim 14, wherein a key frame corresponding to the subsequent model is created, the key frame, once defined requires no reference to data corresponding to any other model definition.

21. The computer system recited in claim 14, wherein a key frame that is an aggregate of a plurality of changesets applied to a model definition or previous key frame is created.

22. The computer system recited in claim 14, comprising code that, when executed by the processor, is adapted to cause the processor to create a visualization of the 3D object.

23. The computer system recited in claim 22, wherein data corresponding to topological elements that are replaced from an initial model to the subsequent model are removed from the visualization.

24. A method for producing hydrocarbons from an oil and/or gas field using a model of data describing a physical structure of the oil and/or gas field, the method comprising:
    defining a three-dimensional (3D) object that corresponds to a physical structure of the oil and/or gas field, the 3D object comprising a set of topological elements that each has an initial geometric definition;

defining a subset of topological elements, which is less than an entirety of the set of topological elements, using an enriched finite element modeling (EFEM) technique;

using a computer to create a subsequent model of the data by updating the subset of the topological elements defined using the EFEM technique in the 3D object, each updated topological element in the subset of topological elements having a geometric definition that has changed relative to its initial geometric definition; and extracting hydrocarbons from the oil and/or gas field using the subsequent model.

25. A computer-implemented method for obtaining a model of data describing a physical structure, the method comprising:

defining a three-dimensional (3D) object that corresponds to a physical structure, the 3D object comprising a set of topological elements that each has an initial geometric definition;

defining a subset of topological elements, which is less than an entirety of the set of topological elements, using an enriched finite element modeling (EFEM) technique; and using a computer to create a subsequent model of the 3D object by modifying the subset of the topological elements defined using the EFEM technique, deleting the subset of the topological elements defined using the EFEM technique, and/or adding new topological elements defined using the EFEM technique to account for changes relative to its initial geometric definition.

* * * * *